(12) United States Patent
Ellis et al.

(10) Patent No.: US 11,726,717 B2
(45) Date of Patent: Aug. 15, 2023

(54) NAND DROPPED COMMAND DETECTION AND RECOVERY

(71) Applicant: Western Digital Technologies, Inc., San Jose, CA (US)

(72) Inventors: Robert Ellis, San Jose, CA (US); Kevin O'Toole, San Jose, CA (US); Jacob Schmier, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 55 days.

(21) Appl. No.: 17/490,531

(22) Filed: Sep. 30, 2021

(65) Prior Publication Data

US 2022/0019382 A1    Jan. 20, 2022

Related U.S. Application Data

(63) Continuation of application No. 16/786,889, filed on Feb. 10, 2020, now Pat. No. 11,150,841.

(51) Int. Cl.
*G06F 3/00* (2006.01)
*G06F 3/06* (2006.01)
*G11C 16/32* (2006.01)
*G11C 16/04* (2006.01)

(52) U.S. Cl.
CPC .......... *G06F 3/0659* (2013.01); *G06F 3/0604* (2013.01); *G06F 3/0679* (2013.01); *G11C 16/0483* (2013.01); *G11C 16/32* (2013.01)

(58) Field of Classification Search
CPC ... G11C 16/32; G11C 16/0483; G11C 7/1063; G11C 7/22; G06F 3/0604; G06F 3/0659; G06F 3/0679; G06F 3/061; G06F 3/0688; G06F 13/1668; G06F 13/1689; G06F 13/362; G06F 13/385; G06F 13/4068; G06F 12/0246; G06F 11/1068; G06F 3/0619; G06F 3/0653; G06F 13/161; G06F 13/1673; G06F 2212/7201; G06F 2212/7203; G06F 9/4418
See application file for complete search history.

(56) References Cited

U.S. PATENT DOCUMENTS

| | | | |
|---|---|---|---|
| 7,793,167 B2 | 9/2010 | Hafner et al. |
| 8,996,782 B2 | 3/2015 | Ide et al. |
| 9,218,284 B2 | 12/2015 | Yoon et al. |
| 9,335,952 B2 | 5/2016 | Buxton et al. |

(Continued)

*Primary Examiner* — Thong Q Le
(74) *Attorney, Agent, or Firm* — ArentFox Schiff LLP

(57) ABSTRACT

Aspects of a storage device including a memory and a controller are provided which allow for detection of dropped commands based on a die status (ready/busy status) of a command received from a host device. The memory may include dies controlled by chip-enables (CE). After selecting a die using CE, the controller waits between a minimum and maximum time after receiving the command to query the die status, where the minimum time is the time by which the command is expected to begin execution and the maximum time is the shortest time by which the command is expected to complete execution. The controller queries the die status after waiting the time period. If the die status is ready when it should have read busy, the controller detects that the command associated with the data is dropped and requests the host device to reissue the command.

20 Claims, 7 Drawing Sheets

(56) References Cited

U.S. PATENT DOCUMENTS

| | | | |
|---|---|---|---|
| 9,620,182 B2 * | 4/2017 | Tuers | G06F 13/1668 |
| 2009/0172213 A1 | 7/2009 | Jayachandran et al. | |
| 2014/0325131 A1 | 10/2014 | Lassa et al. | |

* cited by examiner

NAND DROPPED COMMAND DETECTION AND RECOVERY

CROSS REFERENCE TO RELATED APPLICATION(S)

This application is a continuation of U.S. patent application Ser. No. 16/786,889, titled "NAND Dropped Command Detection and Recovery," filed on Feb. 10, 2020, of which is incorporated herein by reference in its entirety.

BACKGROUND

Field

This disclosure is generally related to electronic devices and more particularly to storage devices.

Background

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may store control information associated with data. For example, a flash storage device may maintain control tables that include a mapping of logical addresses to physical addresses. This control tables are used to track the physical location of logical sectors, or blocks, in the flash memory. The control tables are stored in the non-volatile memory to enable access to the stored data after a power cycle.

The flash storage device may be packaged with multiple dies which share a single bus. Each die may include a Chip Enable (CE) (or Chip Select (CS)) pin which allows a controller of the flash storage device to send a signal to enable (or select) one of the dies for executing commands from a host device. For example, when the flash storage device receives a read command to read data from one die, the controller may use CE to select the die (e.g. activate or wake up the die) before reading the data from that die. The controller may select between dies by sending CEs directed to those dies accordingly.

However, when the flash storage device sends CE signals to select between or activate different dies, the die may not respond correctly to the CE signal. For example, if there is a flaw in the NAND circuitry such as a metal to metal short, the die may be activated later than expected. If the controller subsequently attempts to read, write, or erase data from the die before the die is successfully activated, the die may not process the command. As a result, the command may be silently dropped.

SUMMARY

One aspect of a storage device is disclosed herein. The storage device includes a memory and a controller coupled to the memory. The controller may be configured to perform a die status query with the memory for a host command at a time after a first time at which the host command is expected to begin execution and prior to a second time at which the host command is expected to complete execution. The controller is further configured to detect whether the host command is dropped based on the die status query. The die status query may indicate one of a ready status or a busy status.

Another aspect of a storage device is disclosed herein. The storage device includes a memory and a controller coupled to the memory. The controller may be configured to receive, from a host device, a data command. The controller is further configured to query a die status from the memory at a time after a first time at which the data command is expected to begin execution and prior to a second time at which the data command is expected to complete execution. The controller is further configured to detect whether the data command is dropped based on the die status. The die status includes one of a ready status or a busy status.

A further aspect of a storage device is disclosed herein. The storage device includes a memory and a controller coupled to the memory. The controller may be configured to issue a storage device command to a particular die in the memory based on a host command. The controller is further configured to perform a dropped command detection (DCD) status query on the particular die within a time period after the storage device command is issued, the DCD status query indicating whether the storage device command is dropped, the time period being bounded by a first time at which the storage device command is expected to begin execution and a second time at which the storage device command is expected to complete execution.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1:
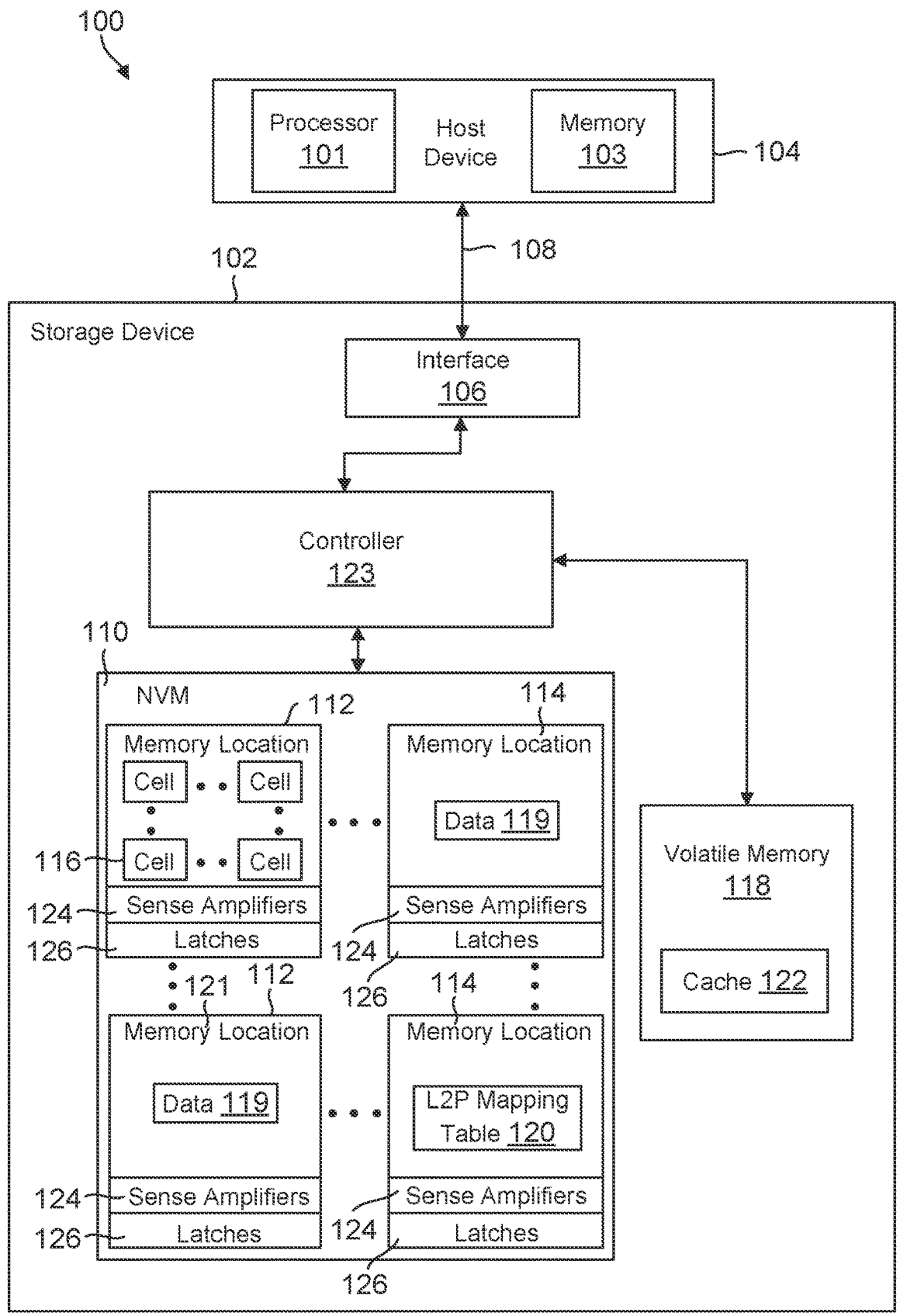
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

When a controller of a storage device attempts to select between CEs of different dies, the selected die may not be activated within acceptable timing parameters. As a result, if the controller subsequently sends one or more command bytes to the selected die attempting to read, write, or erase data in NAND, the die may not correctly process the command bytes leading to respective dropping of the read, write, or erase command. As read commands are typically sent the most frequently of the aforementioned commands, these commands tend to be dropped the most frequently in such circumstances.

The dropping of commands due to problems in CE-to-CE selection may be unknown by the controller of the storage device. For example, if the controller attempts to execute a read command in the NAND in an unintendedly deactivated die, the data may not be sensed from the NAND into latches. As a result, previous data (e.g. from a prior read command) may unknowingly be transferred from the latches to the controller, which may not be detectable by the storage device since, e.g., error correction code (ECC) decoding may still succeed. While the controller normally sends periodic status commands to identify a ready/busy status of the die, which indicates whether the die is currently executing a command (e.g. the die is busy) or is finished executing a command (e.g. the die is ready), such status commands are sent after the maximum anticipated time for executing host commands. As a result, even if the controller determines that the die is ready from the ready/busy status, it is unknown whether the die is ready because it correctly executed the last command, or because it remained ready the entire time since the previous command and never went busy.

One approach to address the aforementioned problem from delayed CE-to-CE selection is to increase the time delay (tCS) between assertion of the CE signal and presenting of the command on the bus to the NAND. While such approach may reduce the probability of dropped commands by adding additional time to account for late CE activation, this approach does not guarantee that dropped commands have not occurred. For example, the controller of the storage device may be limited to a maximum tCS, and if late activation of the die from CE happens to occur after the maximum tCS, dropped commands may still result. Moreover, increasing tCS is a global change that may significantly reduce storage device performance, since the delay may affect the execution timing of all dies sharing the same bus with the controller for all types of commands (e.g. including dies which may not have CE-to-CE selection problems).

Therefore, in order to detect the dropping of commands due to CE-to-CE selection problems without reduction in performance, the present disclosure provides an approach for dropped command detection (DCD) which relies upon querying the ready/busy status of the storage device within a time envelope after a command is issued by the storage device, but before the storage device is likely to complete processing of the command. The time envelope is configured such that the controller of the storage device does not attempt to query the status too early (e.g. while the command is still being initialized and thus any ready/busy status indicator would be invalid), or too late (e.g. when the command may have already completed execution as is generally the case during normal, periodic status inquiries as described above). If the status reads ready during this time envelope, the controller may determine that the command was dropped and can immediately take remedial measures, while if the status reads busy during the time envelope, the controller may determine that the command is correctly being executed. As a result, the present disclosure allows for the controller to perform dropped command detection without the reduction in performance that may be caused by imposing global time delays (e.g. tCS changes).

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

As shown in the exemplary embodiment of FIG. 1, the storage device 102 includes non-volatile memory (NVM) 110 for non-volatilely storing data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the illustrated exemplary embodiment of FIG. 1, each memory location 112 may be a block 114 including multiple cells 116. The cells 116 may be SLCs, MLCs, TLCs, QLCs, and/or PLCs, for example. Other examples of memory locations 112 are possible; for instance, each memory location may be a die containing multiple blocks. Moreover, each memory location may include one or more blocks in a 3-D NAND array. Moreover, the illustrated memory locations 112 may be logical blocks which are mapped to one or more physical blocks.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
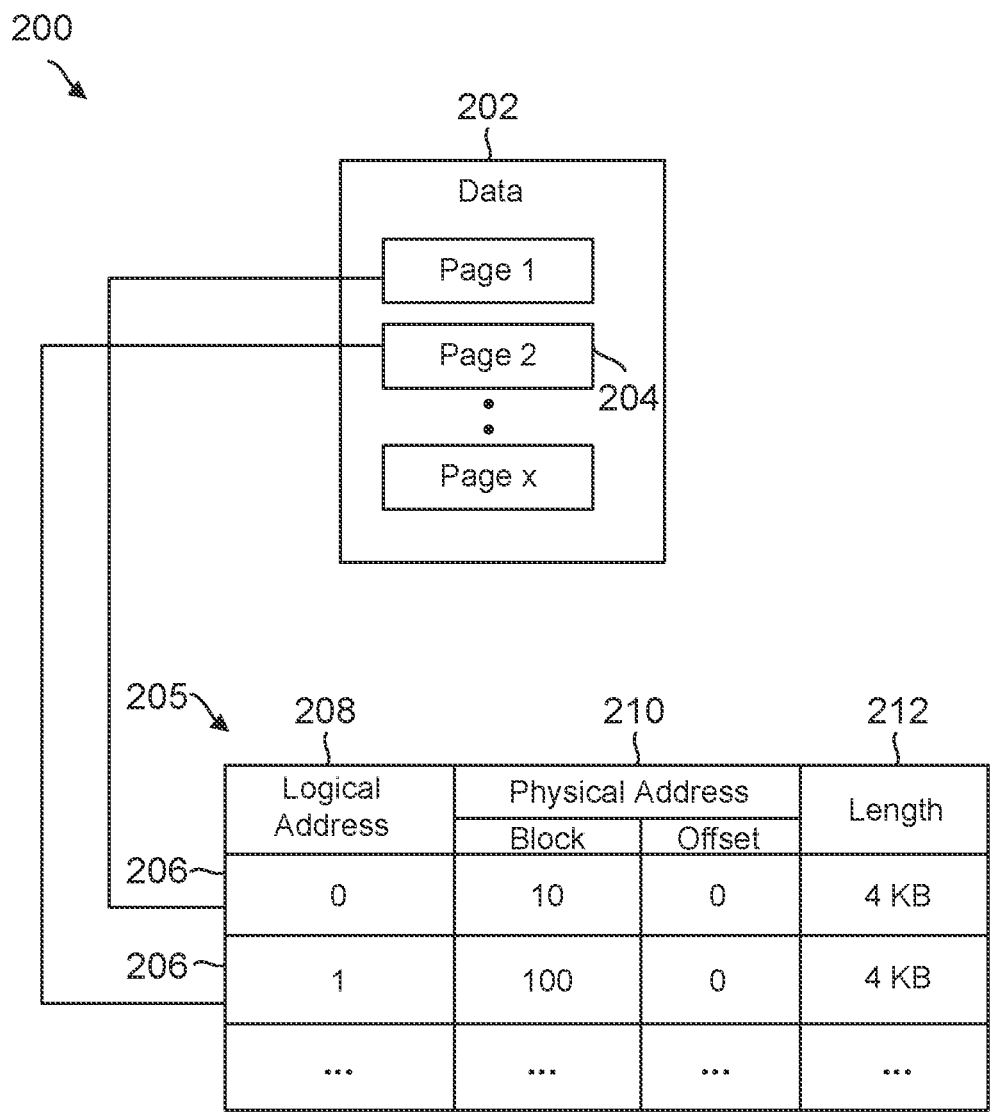
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
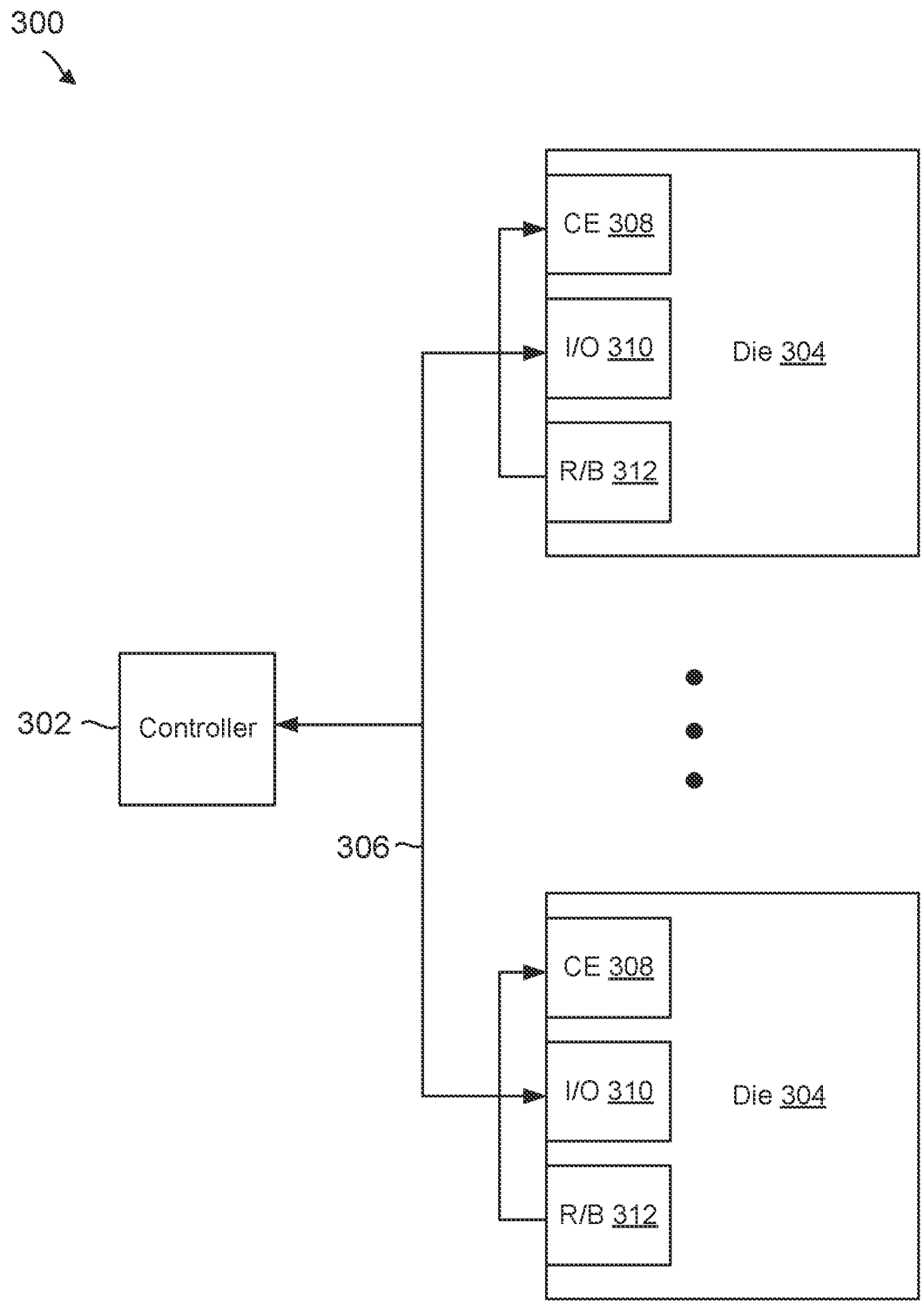
FIG. 3 is a conceptual diagram illustrating an example of a controller in communication with multiple dies in the storage device of FIG. 1.

FIG. 3 illustrates an example diagram 300 illustrating a controller 302 in communication with multiple dies 304 sharing a bus 306. The controller 302 may correspond to controller 123 of FIG. 1, and the dies 304 may correspond to memory locations 112 of FIG. 1. Each die may include various pins which serve as interfaces between the controller and the die. For example, each die may include a CE 308 which is configured to receive a chip-enable signal from the controller, an input/output (I/O) 310 which is configured to receive commands from the controller (e.g. to read, write, or erase data), and a ready/busy (R/B) 312 which is configured to output a ready or busy status (a NAND die status stored in the memory of the die) to the controller. For clarity, only CE 308, I/O 310, and R/B 312 are illustrated in FIG. 3 for each die; however, dies 304 may include other pins. For instance, each die may include an address latch enable (ALE) for latching addresses into NAND, a command latch enable (CLE) for latching commands into a command register, a RE (read enable) for enabling output data buffers, a WE (write enable) for clocking data, addresses, or commands into the NAND, and a bidirectional data strobe signal (DQS) for processing data transactions.

In one example, the controller 302 may receive commands from a host device (e.g. host device 104) for data on different dies. For instance, the controller 302 may receive a first read command for data on one of the dies 304 (e.g. a first die), and the controller 302 may receive a second read command for data on another of the dies 304 (e.g. a second die). Accordingly, to execute the first read command, the controller 302 sends a CE signal on bus 306 to CE 308 of the first die, and after a preconfigured period of time (e.g. tCS described above), the controller 302 sends a command on bus 306 to I/O 310 to read the data from the first die. For instance, the controller may send a command to activate sense amplifiers (e.g. sense amplifiers 124 of FIG. 1) to sense data from the first die (e.g. data 119), and then to transfer the sensed data from the latches (e.g. latches 126) to the controller. While the controller is waiting for the first read command to be executed, the controller 302 may execute the second read command by sending a CE signal on the bus to CE 308 of the second die, and after the preconfigured period of time tCS, the controller sends a command to I/O 310 to similarly sense other data from the second die. The controller may similarly interact with the other dies on bus 306 while commands are being executed for their respective dies.

If the controller receives a new command or determines to execute another queried command from the host device for one of the dies 304, the controller waits until it determines that a prior command is finished before executing the new command on that die. That is, the controller waits a period of time corresponding to a maximum anticipated time for completing execution of the prior command, and then polls the die by sending periodic ready/busy status inquiries to the die. For instance, if the controller is planning to execute another read command for the first die, the controller waits until the aforementioned time has elapsed before sending a status command to the first die via I/O 310 for its ready/busy status or checking the R/B 312 for its ready/busy status. If the controller identifies that the die 304 is ready, the controller assumes the die has completed command execution and sends a CE signal to the first die followed by the new command as described above. Alternatively, if the controller identifies that the die is still busy, the controller assumes the die is still executing the prior command and continues polling the status until the die becomes ready. The controller then executes the new command. The process may similarly repeat for all the dies 304. Thus, the controller 302 may switch CE selection between the multiple dies on the bus to execute commands for the different dies.

However, if there's an unaccounted switching delay between the CEs, for instance, due to a metal to metal shorting issue with CE 308 of any of the dies, the controller 302 may send the new command to I/O 310 to read, write, or erase data on the die 304 before the die is activated by the CE to process the new command. As a result, the command may be ignored or dropped by the respective die. In such case, the controller 302 may not be able to detect the dropped command simply by polling the ready/busy status after the maximum anticipated time for command execution as described above, since an initial determination that the die is ready as a result of the polling may be ambiguous. That is, the die may be ready because it finished executing the new command, or because it finished executing the prior command and never processed the new command. Thus, the dropped commands may be silent (e.g. unknown to the controller). Moreover, increasing tCS to a maximum limit may not help if the CE switching delay is longer than the limit, as well as globally sacrifice performance of all the dies 304 on the bus 306.

Figure 4:
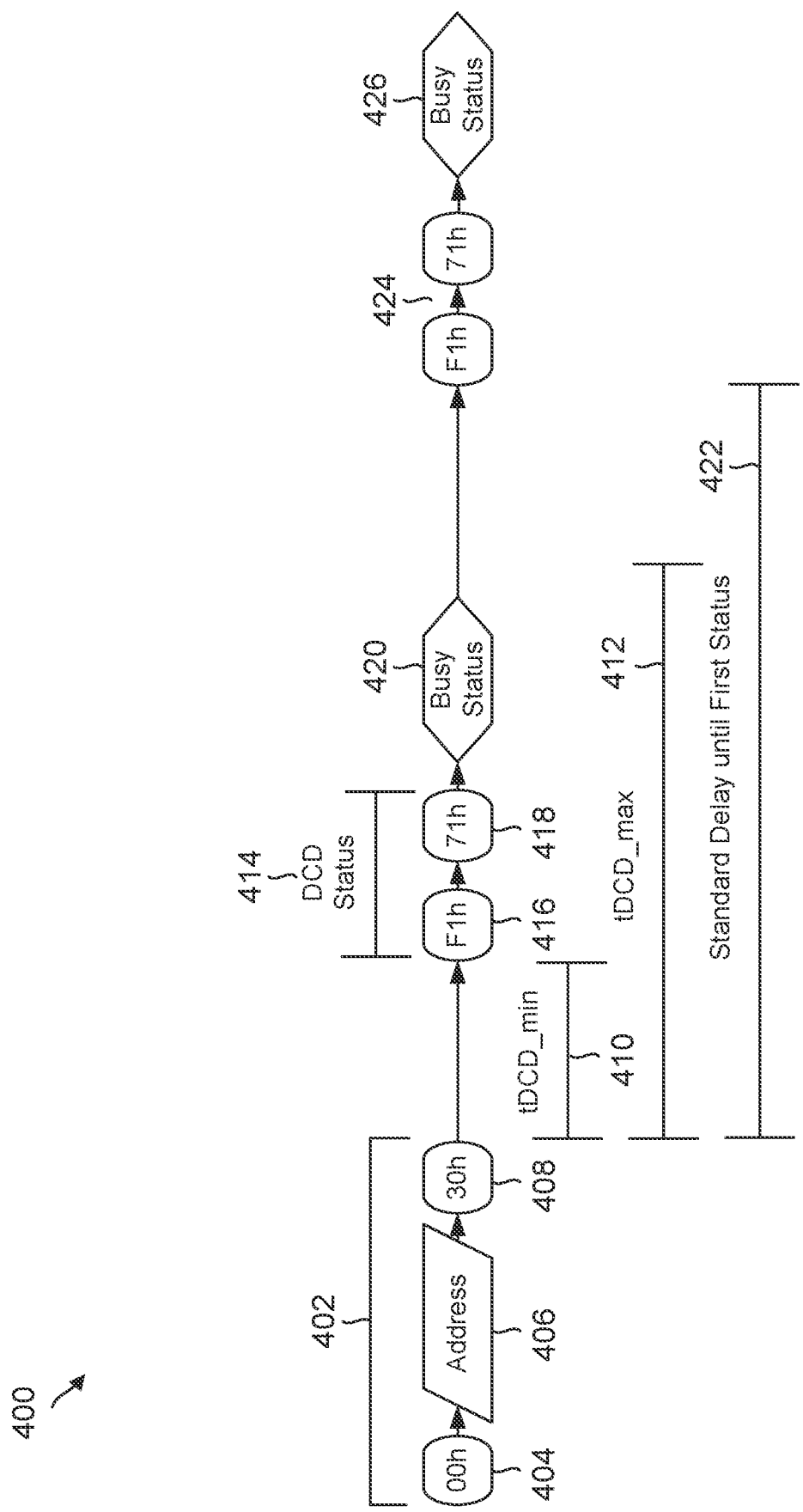
FIG. 4 is a conceptual diagram illustrating an example of a command timing sequence including dropped command detection by the storage device of FIG. 1.

To address this problem of silently dropped commands, the present disclosure incorporates a system of dropped command detection (DCD). FIG. 4 illustrates an example diagram 400 of a command execution timeline including DCD. While FIG. 4 illustrates an example where the controller executes a read command, the controller may execute other commands (e.g. write commands or erase commands) while performing dropped command detection. In this example, the controller issues a NAND read using a multi-byte, read command 402: an initial command 404 (e.g. ooh), followed by a physical address 406 (e.g. five or six bytes) of the data to be read, and a post-command 408 (e.g. 30h). The field including physical address 406 may include an identifier for the die in which the address is located. Thus, referring to FIG. 3, the controller 302 may issue the multi-byte command 402 to I/O 310 of one of the dies to read data from that die.

After issuing the read command for a particular die, the controller waits between a minimum time 410 for the command to initialize or begin execution and a maximum time 412 for the command to complete execution before performing dropped command detection (DCD) on that die. For example, the controller may wait by proceeding to perform other commands for other dies, or by refraining from performing any commands. Once the controller has waited up to a time (e.g. tDCD) within this time envelope, the controller performs a DCD status query 414 of the die status (e.g. ready or busy) of the NAND. The time envelope in which the controller may perform acceptable DCD status queries may thus be defined by tDCD_min<tDCD<tDCD_max, where the minimum time 410 (tDCD_min) is the shortest time for a ready/busy status of the die to be valid (e.g. 600 ns or another number for a read command), and the maximum time 412 (tDCD_max) is the shortest time before the command 402 can be considered completed (e.g. 30 μs or another number for a read command). Thus, the maximum time 412 for tDCD may itself be a minimum time for command execution completion (e.g. between 30 μs and 100 μs for a read command).

The controller may perform the DCD status query 414 for a die's ready/busy status based on the R/B interface provided by the die, as described above with respect to FIG. 3. For instance, the controller may send a status command on bus 306 to a die 304 via I/O 310 to determine the ready/busy status. While the controller may also read the ready/busy status from the die via a wire connected to R/B 312, this approach may be less advantageous for DCD when multiple dies share the same bus as in FIG. 3. For example, if the controller is connected via a single bus to all the R/B 312 (pins) of each die, the controller may not be able to determine which die originated which status, in contrast to a status command which may identify the selected die. Moreover, reserving additional pins on the controller for separate connection to the R/B 312 of each die may be impractical due to the finite number of pins of the controller.

Accordingly, FIG. 4 illustrates an example where the controller sends a multi-byte status command, including an initial command 416 (e.g. F1h) and a post command 418 (e.g. 71h), to perform DCD. The initial command 416 may indicate the die to which the DCD status query 414 is being targeted, and the post command 418 may indicate to the die an instruction to return its ready/busy status to the controller. These two commands, in combination with the physical address 406 that identifies the target die, allows the correct die to successfully decode and receive the status command. For instance, referring to FIG. 3, one of the dies 304 (a first die) may be identified as die 0, and another of the dies 304 (a second die) may be identified as die 1. Thus, if the second die receives a physical address identifying that die, followed by the initial command F1h and the post command 71h, the second die may successfully decode the status command based on its identifier while the first die and other dies on the bus may fail to decode the status command. Thus, the second die will return its ready/busy status to the controller. This addressing scheme may prevent errors caused by intervening commands (e.g. between the read command 402 and the DCD status query 414, or between the initial command 416 and the post command 418) which target different dies sharing the same bus with the controller.

After the die receives the DCD status query 414 from the controller, if the die is correctly executing the read command 402, the controller will receive a busy status 420 in response to the query from the die. Based on this busy status 420, the controller may determine that the command was not dropped, and the controller may proceed to interact with other dies using the bus until the command is fully executed and the die becomes ready. The controller may determine when the die becomes ready by polling the ready/busy status of the die after the maximum anticipated time for command execution (e.g. standard delay 422) has completed. For example, the standard delay 422 may be 100 μs for a read command, while the standard delay 422 may be 5 ms for an erase command. After the standard delay 422 has elapsed, the controller may periodically transmit status command inquiries 424 to the die to determine whether the die is still busy (e.g. the die returns another busy status 426), or becomes ready.

If, however, the die does not return the busy status 420 in response to the DCD status query 414 and instead returns a ready status, the controller may determine that the command was dropped (e.g. due to CE-to-CE selection delay) and that the read command 402 was not correctly executed. As a result, the controller may incorporate remedial measures, such as notifying the host device, re-sending the read command 402, or performing other error correcting measures.

Thus, the example of FIG. 4 allows the controller to successfully detect dropped commands without waiting the standard delay 422 to check the ready/busy status of the die, which as described above, may be too late for the determination since it is well after the maximum time 412 for DCD and thus the status reported by the die will be ambiguous. For instance, the standard delay 422 may be 100 μs for a read command, while the maximum time 412 for DCD may be 30 μs or another number significantly less than the standard delay. Additionally, while dropped commands may be successfully detected if the DCD status query 414 is sent by the controller any time within the minimum time 410 and the maximum time 412, efficiency may be improved by configuring the controller to send the DCD status query 414 closer to the minimum time 410 (e.g. by 600 ns or another number, rather than 30 μs). As a result, if a problem occurs and the die returns a ready status when it should have returned busy status 420, the controller may be able to determine the dropped command as soon as possible (e.g. at least by the minimum time 410) to quickly take remedial measures, rather than unnecessarily waiting until the maximum time 412 for DCD.

Figure 5:
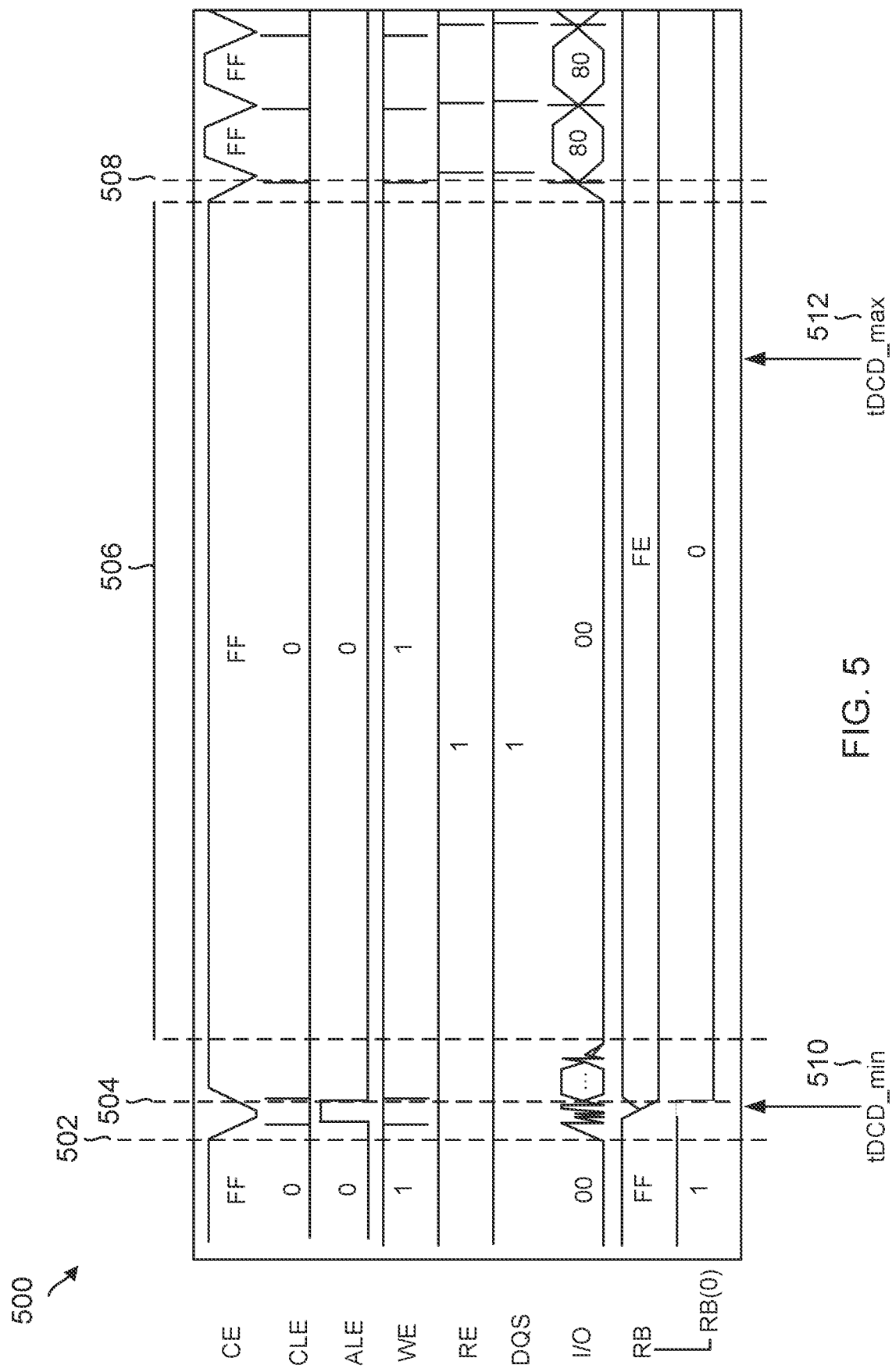
FIG. 5 is a conceptual, timing diagram illustrating an example of signal communication between the controller and dies in the storage device of FIG. 1.

FIG. 5 illustrates an example timing diagram 500 of signals communicated between a controller (e.g. controller 123 or 302) and a die (e.g. die 304) during execution of a read command (e.g. read command 402 of FIG. 4). While various signals noted above with respect to FIG. 3 such as CLE, ALE, WE, RE, and DQS are shown in this example for completeness, only timing related to the signals CE (e.g. CE 308), I/O (e.g. I/O 310), and RB (e.g. RB 312) will be hereafter described.

When the controller receives the read command from the host device, the controller toggles the CE signal (e.g. from 1 to 0) for the die at (or approximately at) timing 502. The controller then issues the read command on I/O to the die at (or approximately at) timing 504, which begins execution of the command and subsequently results in output of a busy status on RB (e.g. 0). Subsequently, during timing 506 (e.g. which may correspond to the span of the standard delay 422 of FIG. 4), the controller generally does not issue any new commands to the die, as the die is expected to be busy executing the prior command as illustrated in FIG. 5. Instead, the controller may proceed to issue commands to other dies on the same bus. After the timing 506, the controller may poll the die beginning at timing 508 by sending status commands (e.g. 80h) via I/O or by checking the RB line to determine whether the die is still busy. In the illustrated example, the die is still busy (e.g. RB(0) is still 0), so the controller continues polling until the RB indicates that the die is ready again (e.g. RB(0) later goes back to 1, although not shown in the Figure). The controller may then execute a new command for the die.

Although FIG. 5 illustrates an example where the command was correctly executed (e.g. the RB line went busy as expected), the command may be silently dropped in other examples. For instance, if timing 502 for the CE toggling occurs later than timing 504 for issuing the read command as described above, the die may not execute the read command and RB(0) may remain 1 (e.g. ready status) the entire time. By the time that polling for ready/busy status begins at timing 508 when the command is expected to complete execution, the controller will detect the ready status but it will be ambiguous; the controller will not be able to determine whether RB(0) was initially 0 and then became 1, or whether it was always 1.

Therefore, to detect such silently dropped commands, the controller may send a status query (e.g. DCD status query 414 of FIG. 4) within configured minimum and maximum DCD timings. For example, the controller may send the status query within a minimum time 510, corresponding to minimum time 410 or tDCD_min, and a maximum time 512, corresponding to maximum time 412 or tDCD_max. For instance, the minimum time 510 may be configured to be a shortest time in which the command is expected to begin execution in the die at or after timing 504, and the maximum time 512 may be configured to be a shortest time in which the command is expected to complete execution within timing 506. Thus, the minimum time and maximum time may be different for different dies (e.g. each tDCD minimum/maximum pair may be dependent on a specific NAND node); for example, timings 504 and 506 may not always be the same for each die. If the controller determines that the status is ready when it was expecting a busy status, then the controller may confidently determine that the command was dropped, and then proceed to re-issue the command again without delay or toggling CE lines.

Figure 6:
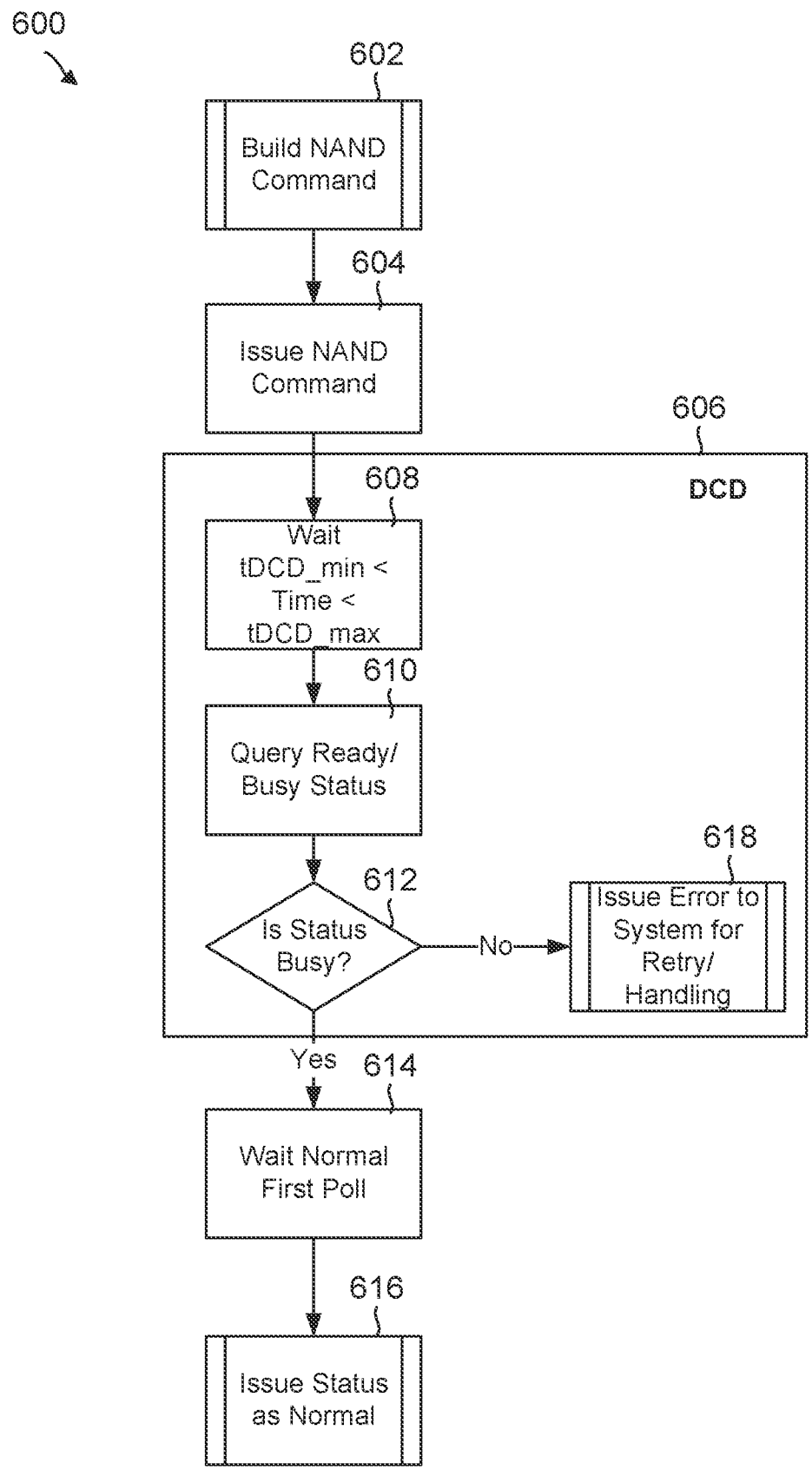
FIG. 6 is a flow chart illustrating a method for performing dropped command detection by the storage device of FIG. 1.

FIG. 6 illustrates an example flow chart 600 of a method of dropped command detection. For example, the method can be carried out in a storage device 102 such as the one illustrated in FIG. 1. Each of the steps in the flow chart can be controlled using the controller as described below (e.g. controller 123), or by some other suitable means.

As represented by block 602, the controller builds a NAND command for a die. For example, when the controller receives a command from the host device (e.g. a read, write, or erase command) including a logical address associated with a memory location in a die, the controller translates the logical address to a physical address in the NAND. For instance, referring to FIG. 2, the controller identifies logical address 208 in L2P mapping table 205 (e.g. L2P mapping table 120 of FIG. 1), and translates the logical address to the physical address 210 to be used for executing the command.

As represented by block 604, the controller issues a NAND command to the die. For example, referring to FIG. 4, the controller may issue read command 402 which includes initial command 404 (e.g. ooh), followed by physical address 406 (e.g. five or six bytes) of the data to be read, followed by post-command 408 (e.g. 30h). The field including physical address 406 may include an identifier for the die in which the address is located. Thus, referring to FIG. 3, the controller 302 may issue the read command 402 to I/O 310 of one of the dies to read data from that die. Alternatively, the controller may execute other commands (e.g. a write command or an erase command) in response to the command received from the host device.

As represented by block 606, after issuing the NAND command for the die, the controller performs DCD. The DCD process may be represented by any combination of blocks 608, 610, 612, and 618, which are described in more detail below.

As represented by block 608, the controller waits for a time t, where tDCD_min<=t<tDCD_max, prior to querying the ready/busy status of the die. For example, referring to FIG. 4, after issuing the read command for a particular die, the controller may wait between minimum time 410 for the command to initialize or begin execution and maximum time 412 for the command to complete execution before performing DCD on that die. For instance, the controller may wait by proceeding to perform other commands for other dies, or by refraining from performing any commands. The time envelope in which the controller may perform acceptable DCD status queries may thus be defined by tDCD_min<tDCD<tDCD_max, where the minimum time 410 (tDCD_min) is the shortest time for a ready/busy status of the die to be valid, and the maximum time 412 (tDCD_max) is the shortest time before the command 402 can be considered completed.

As represented by block 610, the controller may query a ready/busy status of the die. For example, referring to FIG. 4, once the controller has waited up to a time (e.g. tDCD) within this time envelope, the controller performs DCD status query 414 of the die status (e.g. ready or busy) of the die. For instance, the controller may send a status command on bus 306 to a die 304 via I/O 310. As an example of the status command, the controller may send initial command 416 (e.g. F1h) immediately followed by post command 418 (e.g. 71h) to perform DCD on an identified die.

As represented by block 612, the controller determines whether the ready/busy status of the die reads busy. If the die reads busy, then the controller may detect that the command has not dropped, and as represented by block 614, the controller waits to perform a normal (standard) first poll of the ready/busy status of the die. The controller then periodically polls the status of the die until the status eventually reads ready, after which, as represented by block 616, the controller issues a report to the host device that the status of the die is normal. For example, referring to FIG. 4, after the die receives the DCD status query 414 from the controller, if the die is correctly executing the read command 402, the controller will receive a busy status 420 in response to the query from the die. Based on this busy status 420, the controller may determine that the command was not dropped, and the controller may proceed to interact with other dies using the bus until the command is fully executed and the die becomes ready. The controller may determine when the die becomes ready by polling the ready/busy status of the die after the maximum anticipated time for command execution (e.g. standard delay 422) has completed. For example, after the standard delay 422 has elapsed, the controller may periodically transmit status command inquiries 424 to the die to determine whether the die is still busy (e.g. the die returns another busy status 426), or becomes ready. Once the die becomes ready, the controller may notify the host device that the die's operation is working normally.

However, if the die reads ready based on the determination at block 612, then the controller detects the command was dropped, and as represented by block 618, the controller issues an error to the system for retrying the command or other handling. For example, referring to FIG. 4, if the die does not return the busy status 420 in response to the DCD status query 414 and instead returns a ready status, the controller may determine that the command was dropped (e.g. due to CE-to-CE selection delay) and that the read command 402 was not correctly executed. As a result, the controller may incorporate remedial measures, such as notifying the host device, re-sending the read command 402, or performing other error correcting measures.

Figure 7:
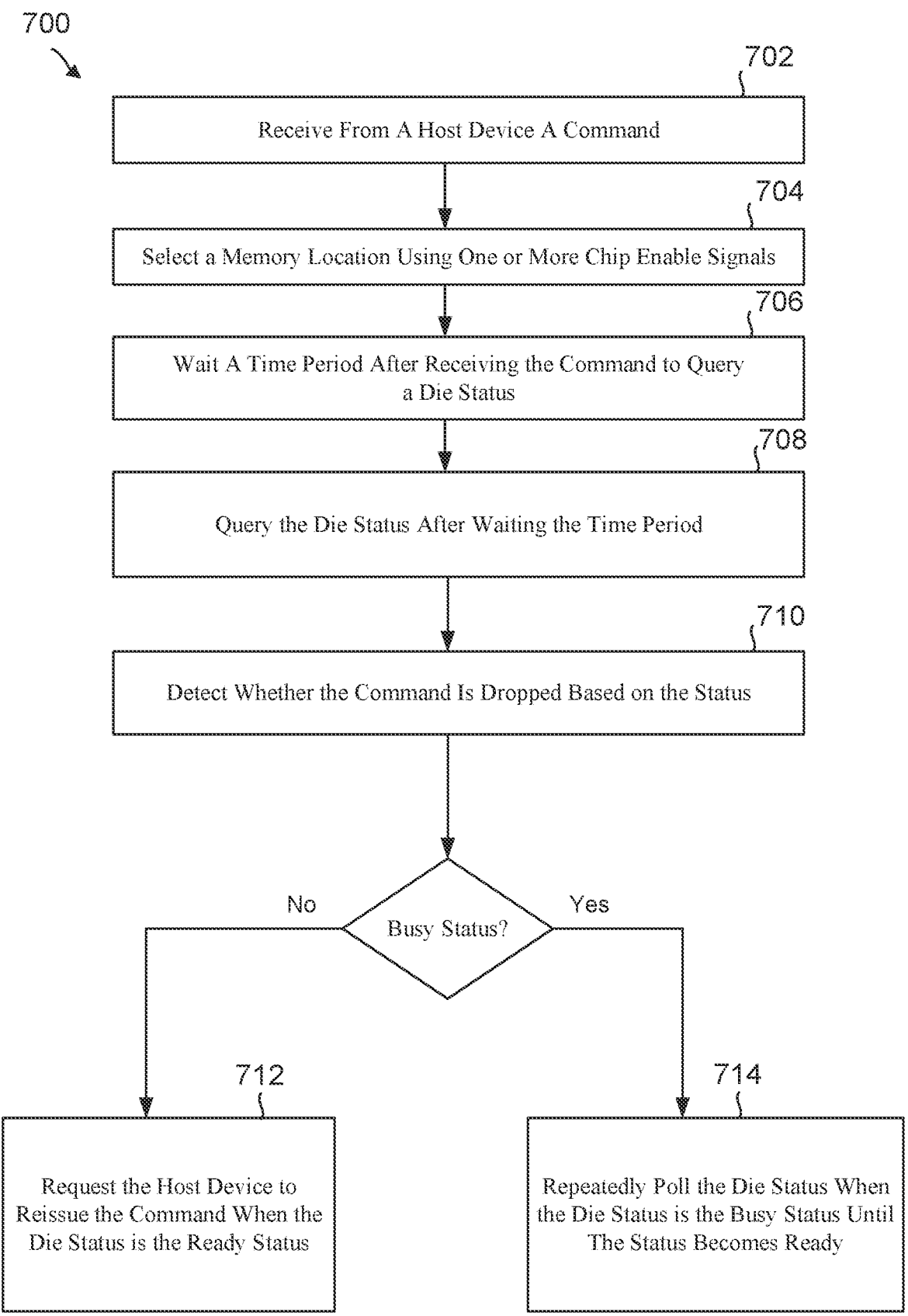
FIG. 7 is a flow chart illustrating an exemplary method for detecting a dropped command by the storage device of FIG. 1.

FIG. 7 illustrates an example flow chart 700 of another method of dropped command detection. For example, the method can be carried out in a storage device 102 such as the one illustrated in FIG. 1. Each of the steps in the flow chart can be controlled using the controller as described below (e.g. controller 123), or by some other suitable means.

As represented by block 702, the controller may receive from a host device a command associated with data for a memory location of a plurality of memory locations. The plurality of memory locations may be controlled by one or more CE signals; for instance, the plurality of memory locations may include dies sharing a single bus with the controller. A die status may be stored in the memory location, and the die status may include one of a ready status or a busy status. For example, referring to FIG. 3, the controller 302 may receive commands from a host device (e.g. host device 104) for data on different dies 304 sharing a bus 306. For instance, the controller 302 may receive a first read command for data on one of the dies 304 (e.g. a first die), and the controller 302 may receive a second read command for data on another of the dies 304 (e.g. a second die). The controller 302 may correspond to controller 123 of FIG. 1, and the dies 304 may correspond to memory locations 112 of FIG. 1. Each die may include various pins such as a CE 308 which is configured to receive a chip-enable signal from the controller, an input/output (I/O) 310 which is configured to receive commands from the controller (e.g. to read, write, or erase data), and a ready/busy (R/B) 312 which is configured to output a ready or busy status (a die status stored in the memory of the die) to the controller.

As represented by block 704, the controller may select the memory location using the one or more CE signals. For example, referring to FIG. 3, when the controller 302 is executing the first read command for one of the dies 304 (e.g. the first die) the controller may send a CE signal on bus 306 to CE 308 of the first die, and when the controller is executing the second read command for another of the dies 304 (e.g. the second die), the controller may send a CE signal on bus 306 to CE 308 of the second die. After a preconfigured period of time (e.g. tCS described above), the controller 302 may send a command on bus 306 to I/O 310 to read the data from the corresponding die.

As represented by block 706, the controller may wait a time period $t_{DCDmin}<=t<t_{DCDmax}$ after receiving the command to query the die status stored in the memory, wherein $t_{DCDmin}$ is a minimum time by which the command is expected to begin execution and $t_{DCDmax}$ is a minimum time by which the command is expected to complete execution. $t_{DCDmin}$ and $t_{DCDmax}$ may be different for different dies. For example, referring to FIG. 6, as represented by block 608, the controller may wait for a time t, where tDCD_min<=t<tDCD_max, prior to querying the ready/ busy status of the die. For instance, referring to FIG. 4, after issuing the read command for a particular die, the controller may wait between minimum time 410 for the command to initialize or begin execution and maximum time 412 for the command to complete execution before querying a ready/busy status of that die. Referring to FIG. 5, the minimum time 510 (e.g. minimum time 410) may be configured to be a shortest time in which the command is expected to begin execution in the die at or after timing 504, and the maximum time 512 (e.g. maximum time 412) may be configured to be a shortest time in which the command is expected to complete execution within timing 506. Thus, the minimum time and maximum time may be different for different dies (e.g. each tDCD minimum/maximum pair may be dependent on a specific NAND node), since timing 504 and timing 506 may not always be the same for each die.

As represented by block 708, the controller may query the die status after selecting the memory location and waiting the time period. The controller may query the die status by one of sending status commands to one of the dies on the single bus, or reading a busy wire of one of the dies. For example, referring to FIG. 6, as represented by block 610, the controller may query a ready/busy status of the die. For instance, referring to FIG. 4, once the controller has waited up to a time (e.g. tDCD) within this time envelope, the controller may perform DCD status query 414 of the die status (e.g. ready or busy) of the die. For instance, the controller may send a status command on bus 306 to the die 304 via I/O 310. As an example of the status command, the controller may send initial command 416 (e.g. F1h) immediately followed by post command 418 (e.g. 71h) to perform DCD on an identified die. Alternatively, the controller may read the ready/busy status from the die via a wire connected to the pin RB 312.

As represented by block 710, the controller may detect whether the command associated with the data is dropped based on the die status. For example, referring to FIG. 4, after the die receives the DCD status query 414 from the controller, if the die is not executing a command, the die will return a ready status to the controller in response to the query. For instance, the die 304 may report a status response including its ready status to the controller on the bus 306 via I/O 310, or the die may return a "1" (ready) on the bus 306 via R/B 312. Based on the identified status, the controller may determine that the command was dropped and that the read command 402 was not correctly executed, since the controller received a ready status when it was expecting a busy status.

If the command is dropped, then as represented by block 712, the controller may request the host device to reissue the command when the die status is the ready status. For example, referring to FIG. 6, as represented by block 618, the controller may issue an error to the system for retrying the command or other handling. For instance, referring to FIG. 4, if the die does not return a busy status 420 in response to the DCD status query 414 and instead returns a ready status, the controller may determine that the command was dropped (e.g. due to CE-to-CE selection delay) and that the read command 402 was not correctly executed. As a result, the controller may incorporate remedial measures, such as notifying the host device, re-sending the read command 402, or performing other error correcting measures.

Otherwise, as represented by block 714, the controller repeatedly polls the die status when the die status is the busy status until the die status becomes the ready status. For example, referring to FIG. 6, if the die reads busy, then as represented by block 614, the controller waits to perform a normal (standard) first poll of the ready/busy status of the die. The controller then periodically polls the status of the die until the status eventually reads ready. For instance, after standard delay 422 has elapsed, the controller may periodically transmit status command inquiries 424 to the die to determine whether the die is still busy (e.g. the die returns another busy status 426), or becomes ready. Once the die becomes ready, the controller may notify the host device that the die's operation is working normally.

Accordingly, the present disclosure allows for detection of dropped commands while increasing system stability, increasing performance, and reducing the impact of dropped commands to Quality of Service (QoS). System stability may be increased by allowing dropped commands to be detected without globally increasing the time between when dies are selected using CE and the time when each command is eventually executed (e.g. without increasing tCS), as such approach may not even guarantee the detection of dropped commands as described above. Performance may thus be increased without impact to system stability by avoiding increase of tCS, thereby allowing commands to maintain fast execution. Moreover, read operations may be performed with improved QoS since the storage device may determine that the read sense was not correctly executed and, as a result, unintended data (e.g. previously read data for a different command that passes decoding or ECC checks) or invalid data (e.g. data that does not decode and thus may force an error recovery path) may be detected before being transferred to the host device.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
   a memory; and
   a controller coupled to the memory and configured to:
      perform a die status query with the memory for a host command at a time after a first time at which the host command is expected to begin execution and prior to a second time at which the host command is expected to complete execution; and
      detect whether the host command is dropped based on the die status query.

2. The storage device of claim 1, wherein the controller is further configured to:
receive, from a host device, the host command, the host command indicating a request to perform a storage device operation with the memory; and
wait a time period after receiving the host command to perform the die status query, wherein the time period is bounded by the first time and the second time.

3. The storage device of claim 2, wherein the first time corresponds to a minimum time by which the die status query is to be valid and the second time corresponds to a minimum time by which the host command is to complete execution with the memory.

4. The storage device of claim 1, wherein the controller is further configured to:
receive a busy status from a particular die in the memory in response to the die status query; and
determine that the host command is not dropped and being executed correctly based on the busy status.

5. The storage device of claim 1, wherein the controller is further configured to:
receive a ready status from a particular die in the memory in response to the die status query; and
determine that the host command is dropped and not executed correctly based on the ready status.

6. The storage device of claim 1, wherein the first time and the second time are different between different dies of the memory.

7. The storage device of claim 1, wherein the controller is further configured to issue other storage device commands to one or more dies of the memory while the controller waits to perform the die status query with a particular die of the memory.

8. The storage device of claim 1, wherein the controller is further configured to refrain from issuing storage device commands to one or more dies of the memory while the controller waits to perform the die status query with a particular die of the memory.

9. A storage device, comprising:
a memory; and
a controller coupled to the memory and configured to:
receive, from a host device, a data command;
query a die status from the memory at a time after a first time at which the data command is expected to begin execution and prior to a second time at which the data command is expected to complete execution; and
detect whether the data command is dropped based on the die status.

10. The storage device of claim 9, wherein the controller is further configured to wait a time period after receiving the data command to query the die status, wherein the time period is bounded by the first time and the second time.

11. The storage device of claim 10, wherein the first time corresponds to a minimum time by which the die status is to be valid and the second time corresponds to a minimum time by which the data command is to complete execution with the memory.

12. The storage device of claim 9, wherein the first time and the second time are different between different dies of the memory.

13. The storage device of claim 9, wherein the controller is further configured to issue other storage device commands to one or more dies of the memory while the controller waits to query the die status of a particular die in the memory.

14. The storage device of claim 9, wherein the controller is further configured to refrain from issuing storage device commands to one or more dies of the memory while the controller waits to query the die status of a particular die in the memory.

15. A storage device, comprising:
a memory; and
a controller coupled to the memory and configured to:
issue a storage device command to a particular die in the memory based on a host command; and
perform a dropped command detection (DCD) status query on the particular die within a time period after the storage device command is issued, the DCD status query indicating whether the storage device command is dropped, the time period being bounded by a first time at which the storage device command is expected to begin execution and a second time at which the storage device command is expected to complete execution.

16. The storage device of claim 15, wherein the controller is further configured to:
receive, from a host device, the host command, the host command indicating a request to perform a storage device operation with the memory; and
wait a time period after receiving the host command to perform the DCD status query, wherein the time period is bounded by the first time and the second time.

17. The storage device of claim 16, wherein the first time corresponds to a minimum time by which the DCD status query is to be valid and the second time corresponds to a minimum time by which the storage device command is to complete execution with the memory.

18. The storage device of claim 15, wherein the first time and the second time are different between different dies of the memory.

19. The storage device of claim 15, wherein the controller is further configured to issue other storage device commands to one or more dies of the memory while the controller waits to perform the DCD status query with a particular die of the memory.

20. The storage device of claim 15, wherein the controller is further configured to refrain from issuing storage device commands to one or more dies of the memory while the controller waits to perform the DCD status query with a particular die of the memory.

* * * * *